United States Patent [19]

Chen et al.

[11] Patent Number: 5,658,821
[45] Date of Patent: Aug. 19, 1997

[54] METHOD OF IMPROVING UNIFORMITY OF METAL-TO-POLY CAPACITORS COMPOSED BY POLYSILICON OXIDE AND AVOIDING DEVICE DAMAGE

[75] Inventors: Hsin-Pai Chen, Hsin-Chu; Sue-Mei Ku, Yung-gho; Pei-Hung Chen, Hsin-Chu; Chih-Shih Wei, Hsin-Chu, all of Taiwan

[73] Assignee: Taiwan Semiconductor Manufacturing Company, Ltd., Hsin-Chu, Taiwan

[21] Appl. No.: 721,668

[22] Filed: Sep. 27, 1996

[51] Int. Cl.[6] .................................................. H01L 21/70
[52] U.S. Cl. .................................................. 438/396; 438/762
[58] Field of Search .................................... 437/60, 47, 919, 437/52; 148/DIG. 14

[56] References Cited

U.S. PATENT DOCUMENTS

| | | | |
|---|---|---|---|
| 4,997,794 | 3/1991 | Josquin et al. | 437/60 |
| 5,173,437 | 12/1992 | Chi | 437/47 |
| 5,336,632 | 8/1994 | Imamura | 437/919 |
| 5,356,826 | 10/1994 | Natsume | 437/919 |
| 5,434,098 | 7/1995 | Chang | 437/60 |
| 5,500,387 | 3/1996 | Tung et al. | 437/60 |
| 5,554,545 | 9/1996 | Wu et al. | 437/47 |

FOREIGN PATENT DOCUMENTS

| | | |
|---|---|---|
| 0002058 | 1/1983 | Japan. |
| 0170066 | 6/1992 | Japan. |

*Primary Examiner*—Tuan H. Nguyen
*Attorney, Agent, or Firm*—George O. Saile; Larry J. Prescott

[57] ABSTRACT

A method of forming capacitors comprising polysilicon, polysilicon oxide, metal is described which significantly improves uniformity of capacitance across the silicon integrated circuit wafer and avoids damage to electrical contact regions. A first layer of polysilicon oxide is formed on a polysilicon first capacitor plate. The wafer is then dipped in a buffered oxide etch or subjected to a dry anisotropic etch. The etching conditions the polysilicon layer so that subsequent polysilicon oxide growth is very uniform and controllable. A second polysilicon oxide layer is then formed on the polysilicon first capacitor plate. A layer of silicon nitride is formed on the polysilicon oxide and a second capacitor plate is formed on the layer of silicon nitride completing the capacitor. Improved capacitance uniformity across the wafer is achieved and device damage is avoided.

22 Claims, 4 Drawing Sheets

METHOD OF IMPROVING UNIFORMITY OF METAL-TO-POLY CAPACITORS COMPOSED BY POLYSILICON OXIDE AND AVOIDING DEVICE DAMAGE

BACKGROUND OF THE INVENTION (1) Field of the Invention

This invention relates to a method for the formation of capacitors comprising a polysilicon first capacitor plate, polysilicon oxide dielectric, and a metal second capacitor plate which improves uniformity of capacitance and avoids device damage. More particularly the invention relates to conditioning the polysilicon first capacitor plate by forming a thin layer of polysilicon oxide on the polysilicon followed by removal of the polysilicon oxide using a buffered oxide etch or a dry anisotropic etch.

(2) Description of the Related Art

U.S. Pat. No. 5,434,098 to Chang and U.S. Pat. No. 5,500,387 to Tung et al. describe processes using the formation of polysilicon oxide over polysilicon but do not describe the method of preconditioning the polysilicon surface described in this Patent Application.

This Patent Application describes a method of forming a polysilicon oxide dielectric between a polysilicon first capacitor plate and a metal second capacitor plate using preconditioning of the surface of the polysilicon first capacitor plate to achieve very uniform and well controlled polysilicon oxide formation.

SUMMARY OF THE INVENTION

Capacitors comprising a polysilicon first plate, polysilicon oxide dielectric, and metal second plate are often used in MOS-FET, metal oxide semiconductor field effect transistor, integrated circuits. One of the key problems of capacitors manufactured in this way results from the poor uniformity of the thickness of the polysilicon oxide dielectric at different locations of the silicon integrated circuit wafer in which the integrated circuits are formed. This results in excessive capacitance variation of the different capacitors in the integrated circuit wafer. Another problem encountered in the manufacture of capacitors of this type is that during the capacitor etching steps it is difficult to avoid damage to electrical contact regions such as the source/drain regions of MOS-FET circuits.

It is a principle objective of this invention to provide a method of forming capacitors comprising a polysilicon first plate, a polysilicon oxide dielectric, and a metal second plate wherein the thickness of the polysilicon oxide is uniform across the integrated circuit wafer.

It is another principle objective of this invention to provide a method of forming capacitors comprising a polysilicon first plate, a polysilicon oxide dielectric, and a metal second plate which does not damage electrical contact regions.

These objectives are achieved by forming a thin first oxide layer on the polysilicon first capacitor plate, polysilicon oxide, and on the electrical contact regions, silicon oxide. The integrated circuit wafer is then dipped in buffered oxide etch which is followed by a dry vertical anisotropic etch. This buffered oxide etch and dry anisotropic etch removes the thin layer of polysilicon oxide from the polysilicon first capacitor plate, removes the thin layer of silicon oxide from the electrical contact regions, and conditions the polysilicon and silicon surfaces so that subsequent oxide formations will be extremely uniform and well controlled.

A second oxide layer is then formed on the polysilicon first capacitor plate, polysilicon oxide, and on the electrical contact regions, silicon oxide. A layer of silicon nitride is then formed on the integrated circuit wafer covering the polysilicon oxide on the first capacitor plate and the silicon oxide on the electrical contact regions. Using a photoresist mask and standard photolithographic processes the silicon nitride is then removed from all parts of the integrated circuit wafer except over the polysilicon first capacitor plate and the silicon oxide is removed from the electrical contact regions. A layer of metal is then formed over the integrated circuit wafer and patterned to form the second capacitor plate and electrical contacts to the electrical contact regions. This method provides improved uniformity of capacitance and avoids damage to the electrical contact regions during the etching steps.

DESCRIPTION OF THE PREFERRED EMBODIMENTS

Figure 1:
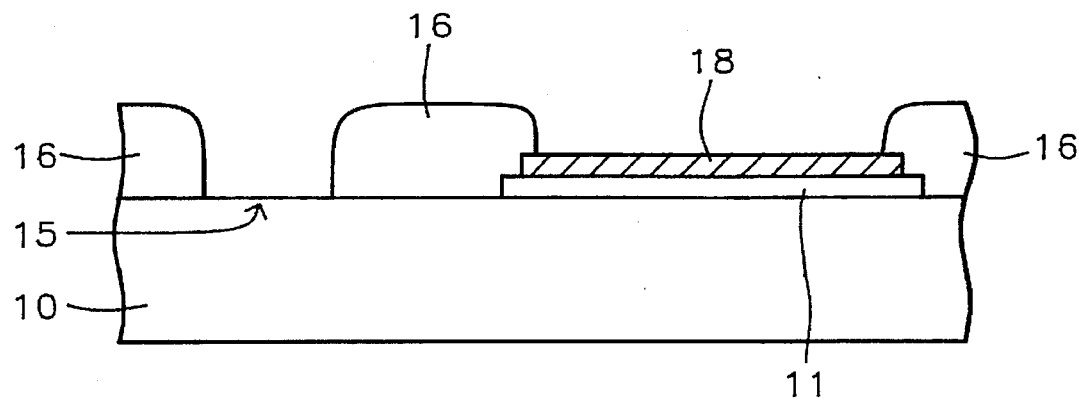
FIG. 1 shows a cross section of an integrated circuit wafer showing the polysilicon first capacitor plate formed on a layer of second dielectric, an electrical contact region, and a layer of first or insulator dielectric.

Refer now to FIGS. 1–11, there is shows the preferred embodiments of the method of forming capacitors on integrated circuit wafers of this invention. FIG. 1 shows a cross section view of a silicon integrated circuit wafer 10 with an electrical contact region 15 and devices, not shown, formed therein. A polysilicon first capacitor plate 18 is formed using conventional deposition and patterning techniques and is shown formed on a layer of second dielectric 11 to provide insulation from the silicon wafer 10. A first or insulator dielectric layer 16, such as borophosphosilicate glass, is formed over the silicon wafer 10 using conventional deposition techniques. That part of the insulator dielectric layer over the polysilicon first capacitor plate 18 and the electrical contact region 15 is removed using conventional masking and etching techniques.

Figure 2:
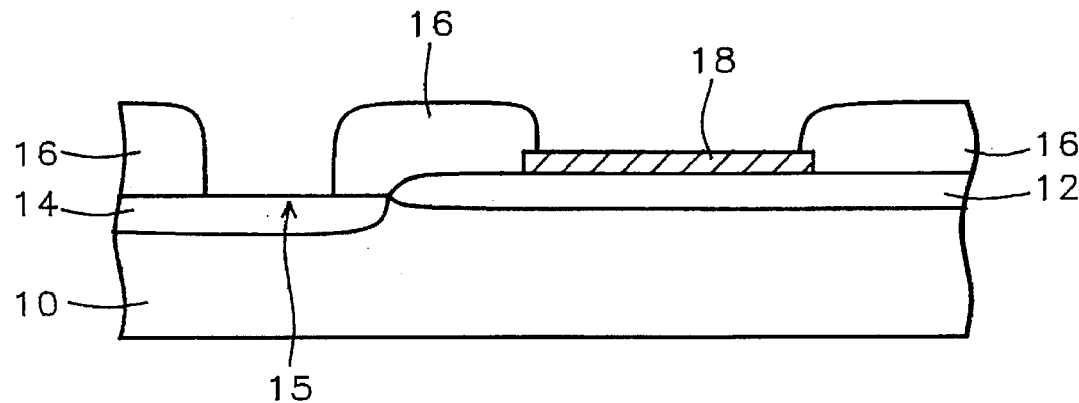
FIG. 2 shows a cross section of an integrated circuit wafer showing the polysilicon first capacitor plate formed on the field oxide isolation region, an electrical contact region as part of a source/drain region, and a layer of insulator dielectric.

FIG. 2 shows a cross section view of a silicon integrated circuit wafer 10 with field oxide isolation regions and devices formed therein. In this case one of the source/drain regions 14 and one of the field oxide isolation regions 12 are shown. The polysilicon first capacitor plate 18 is formed on the field oxide isolation region 12. The electrical contact region 15 is part of the source/drain region 14. A first or insulator dielectric layer 16, such as borophosphosilicate glass, is formed over the silicon wafer 10 using conventional deposition techniques. That part of the insulator dielectric layer over the polysilicon first capacitor plate 18 and the electrical contact region 15 is removed using conventional masking and etching techniques.

The remaining process steps of the method of this invention will now be described using the structure shown in FIG. 2. Those skilled in the art will readily recognize that these same process steps could equally well be used for the structure shown in FIG. 1.

Figure 3:
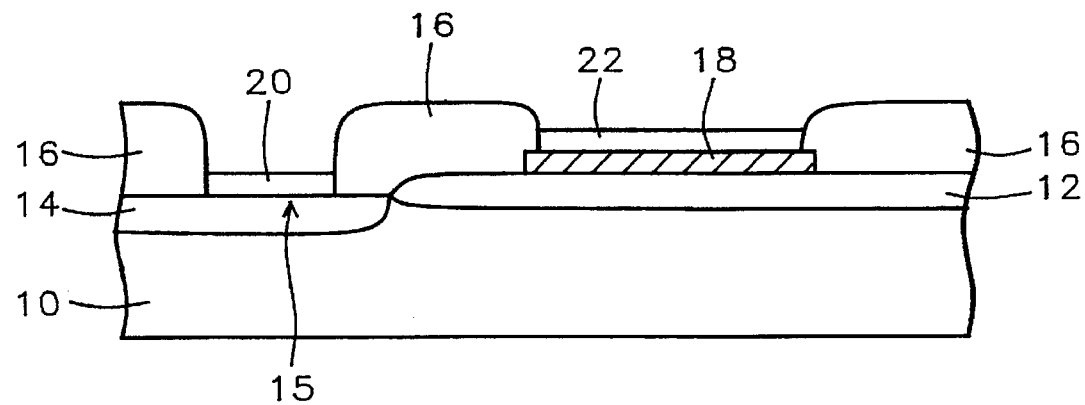
FIG. 3 shows a cross section of the integrated circuit wafer of FIG. 2 showing the layer of first polysilicon oxide on the polysilicon first capacitor plate and the layer of first silicon oxide on the electrical contact region.
Figure 4:
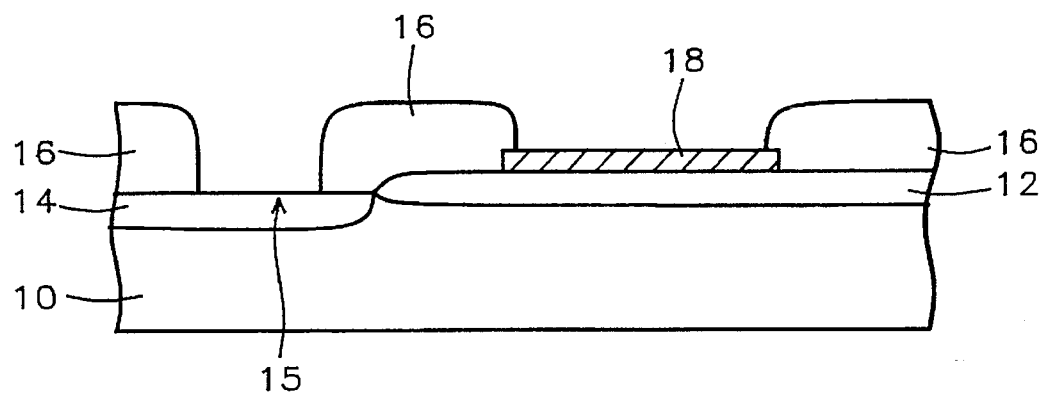
FIG. 4 shows a cross section of the integrated circuit wafer of FIG. 3 after the layer first polysilicon oxide has been removed from the polysilicon first capacitor plate and the layer of first silicon oxide has been removed from the electrical contact region.

As shown in FIG. 3 a thin layer of first polysilicon oxide 22, having a thickness of between about 150 and 250 Angstroms, is formed over the first capacitor plate 18 and a thin layer of first silicon oxide 20, having a thickness of between about 150 and 250 Angstroms, is formed over the electrical contact region 15. In this example both the first silicon oxide 20 and the first polysilicon oxide 22 are thermally grown and are $SiO_2$. Next, as shown in FIG. 4, the silicon integrated circuit wafer 10 is dipped in buffered oxide etch at a temperature of between about 22.5° and 25° C. for between about 30 and 40 seconds or the wafer is subjected to dry anisotropic etching, such as RIE or reactive ion etching. This etching removes the first silicon oxide from the electrical contact region 15 and the first polysilicon oxide from the first capacitor plate 18.

Figure 5:
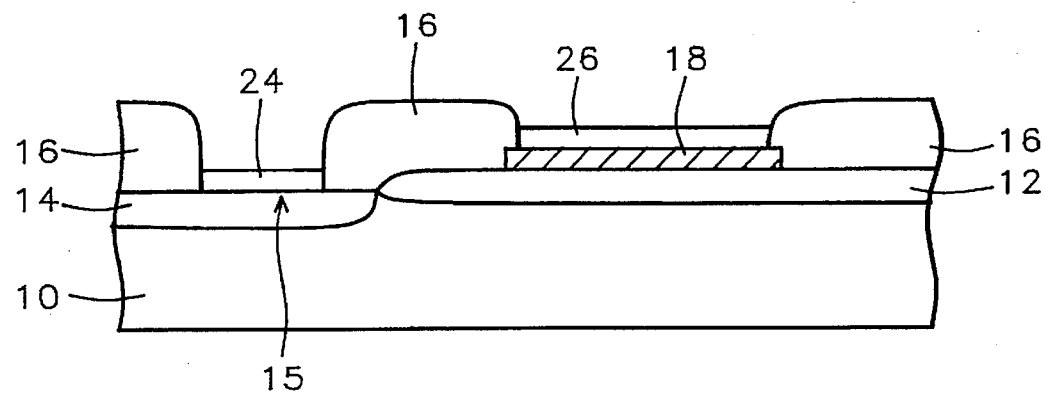
FIG. 5 shows a cross section of the integrated circuit wafer of FIG. 4 showing the layer of second polysilicon oxide on the polysilicon first capacitor plate and the layer of second silicon oxide on the electrical contact region.

The formation and subsequent removal of the thin oxide layers using a buffered oxide etch followed by a dry anisotropic etch conditions the surface of the polysilicon first capacitor plate and the electrical contact region so that subsequent oxide formations will have greatly improved uniformity and controllability. As shown in FIG. 5, a second polysilicon oxide layer 26, having a thickness of between about 150 and 250 Angstroms, is formed on the polysilicon first capacitor plate 18 and a second silicon oxide layer 24, having a thickness of between about 150 and 250 Angstroms, is formed on the electrical contact region 15. In this example both the second silicon oxide 24 and the second polysilicon oxide 26 are thermally grown and are $SiO_2$.

Figure 6:
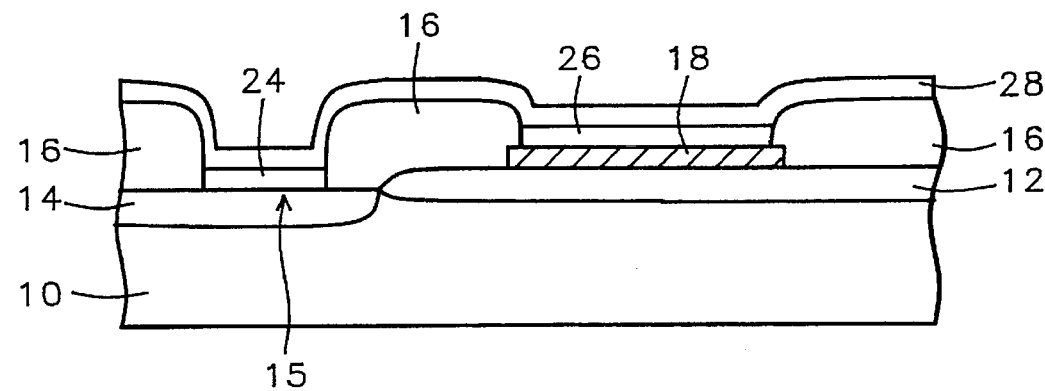
FIG. 6 shows a cross section of the integrated circuit wafer of FIG. 5 after forming a layer of silicon nitride formed on the wafer covering the layer of second polysilicon oxide and the layer of second silicon oxide.
Figure 7:
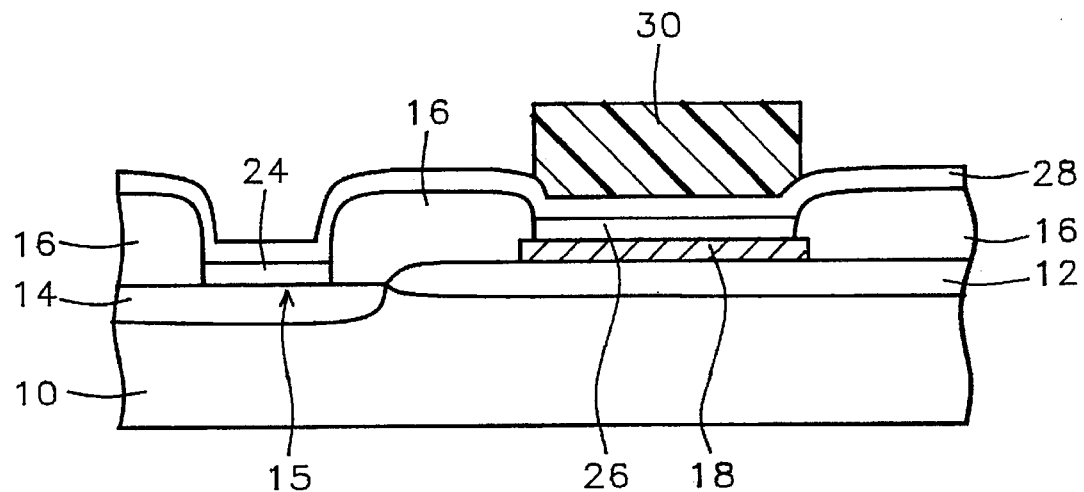
FIG. 7 shows a cross section of the integrated circuit wafer with patterned photoresist formed on the layer of silicon nitride.
Figure 8:
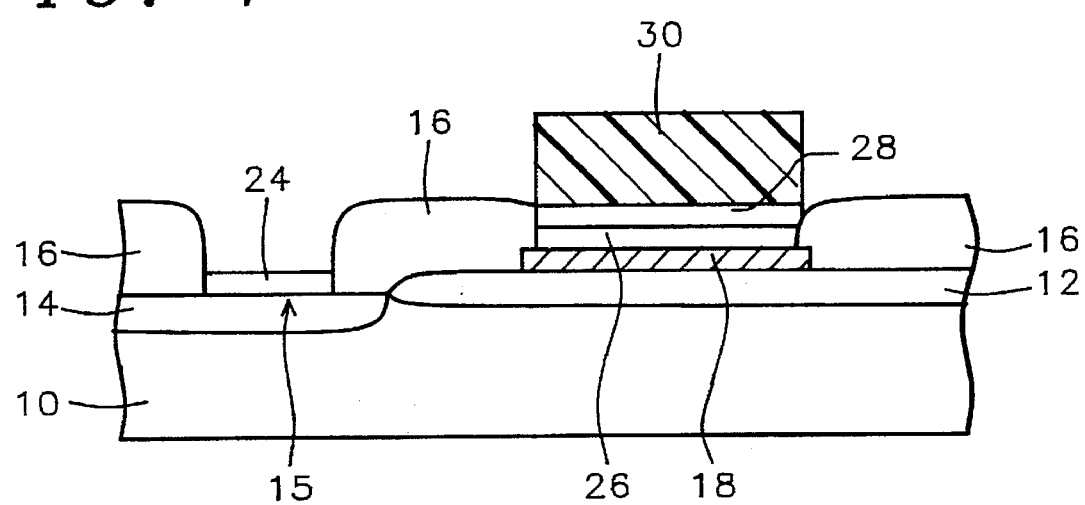
FIG. 8 shows a cross section of the integrated circuit wafer after the second silicon oxide layer formed on the electrical contact region and that part of the silicon nitride layer not covered by the patterned photoresist have been etched away.
Figure 9:
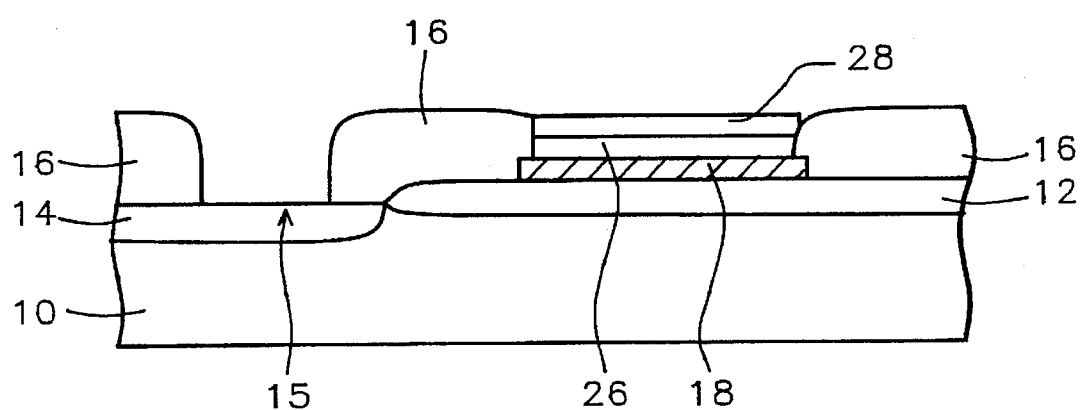
FIG. 9 shows a cross section of the integrated circuit wafer after the patterned photoresist has been removed.

Next, as shown in FIG. 6, a layer of silicon nitride having a thickness of between about 280 and 320 Angstroms is formed on the silicon wafer 10 covering the second polysilicon oxide 26 and the second silicon oxide 24. Next a patterned layer of photoresist 30 is formed on the wafer leaving photoresist only directly above the polysilicon first capacitor plate 18. As shown in FIG. 8, that part of the silicon nitride layer not covered by the photoresist mask 30 and the silicon oxide formed on the electrical contact region 15 are etched away using conventional etching techniques. A layer of silicon nitride 28 remains over the layer of polysilicon oxide 26 formed on the polysilicon first capacitor plate 18. As shown in FIG. 9 the photoresist mask is then removed.

Figure 10:
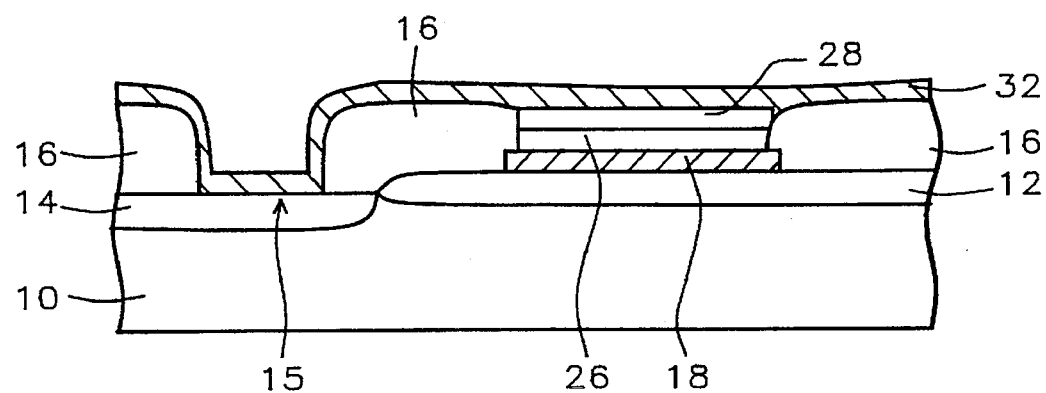
FIG. 10 shows a cross section of the integrated circuit wafer of FIG. 9 after a layer of first metal has been formed on the wafer.
Figure 11:
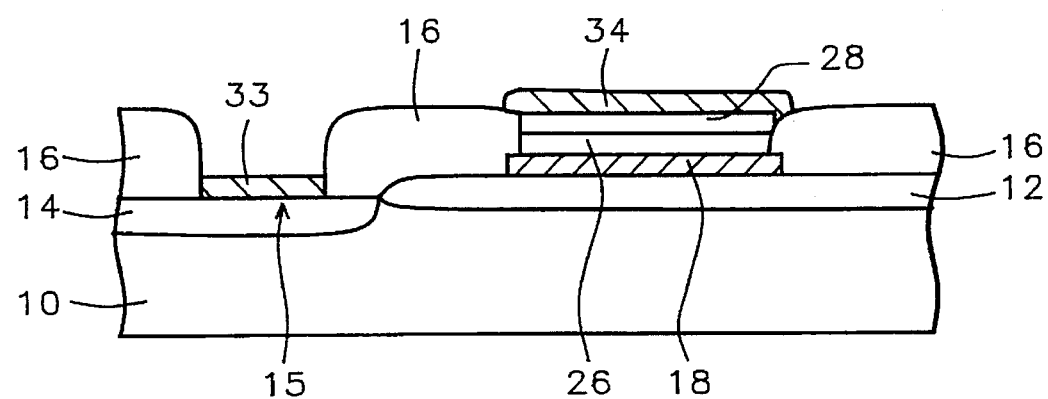
FIG. 11 shows a cross section of the integrated circuit wafer after the layer of first metal has been patterned to form the second capacitor plate and contact to the electrical contact region.

Next, as shown in FIG. 10, a layer of first metal 32, such as TiW/AlSiCu/TiN, is formed over the silicon wafer using conventional deposition techniques, covering the electrical contact region 15 and the silicon nitride 28 over the polysilicon oxide 26. Then, as shown in FIG. 11, the layer of first metal is patterned leaving a first metal second capacitor plate 34, thereby competing the capacitor, and a first metal contact 33 over the electrical contact region 15.

Greatly improved uniformity of capacitance has been achieved with the above described method. Capacitance values across a wafer of 36.9 pf to 37.3 pf have been achieved compared to capacitance values of 35.5 pf to 38.6 pf using conventional processing methods. In addition electrical contact damage has been avoided.

While the invention has been particularly shown and described with reference to the preferred embodiments thereof, it will be understood by those skilled in the art that various changes in form and details may be made without departing from the spirit and scope of the invention.

What is claimed is:

1. A method of forming capacitors, comprising the steps of:

providing a silicon substrate having devices formed therein;

providing electrical contact regions on said silicon substrate;

providing field oxide isolation regions in said silicon substrate;

forming a number of polysilicon first capacitor plates on said field oxide isolation regions;

forming a layer of insulator dielectric over said silicon wafer covering said polysilicon first capacitor plates;

removing that part of said layer of insulator dielectric directly over said polysilicon first capacitor plates;

removing that part of said layer of insulator dielectric directly over said electrical contact regions;

forming a first layer of polysilicon oxide over said polysilicon first capacitor plates;

forming a first layer of silicon oxide over said electrical contact regions;

removing said first layer of polysilicon oxide and said first layer of silicon oxide by means of etching;

forming a second layer of polysilicon oxide over said polysilicon first capacitor plates after removing said first layer of polysilicon oxide;

forming a second layer of silicon oxide over said electrical contact regions after removing said first layer of silicon oxide;

forming a layer of silicon nitride over said silicon wafer covering said second layer of polysilicon oxide;

forming a patterned layer of photoresist over said layer of silicon nitride wherein photoresist remains only directly above said polysilicon first capacitor plates;

removing that part of said layer of silicon nitride not directly above said polysilicon first capacitor plates;

forming a layer of first metal over said silicon substrate covering said part of said layer of silicon nitride not directly above said polysilicon first capacitor plate; and patterning said layer of first metal whereby there is first metal directly above said first capacitor plates, thereby forming second capacitor plates, and first metal directly above said electrical contact regions.

2. The method of claim 1 wherein said polysilicon first capacitor plates have a thickness of between about 150 and 250 Angstroms.

3. The method of claim 1 wherein said first layer of polysilicon oxide has a thickness of between about 150 and 250 Angstroms.

4. The method of claim 1 wherein said second layer of polysilicon oxide has a thickness of between about 150 and 250 Angstroms.

5. The method of claim 1 wherein said removing said first layer of polysilicon oxide and said first layer of silicon oxide uses etching in a wet buffered oxide etch at a temperature of between about 22.5° and 25° C. for between about 30 and 40 seconds.

6. The method of claim 1 wherein said removing said first layer of polysilicon oxide and said first layer of silicon oxide uses dry vertical anisotropic etching.

7. The method of claim 1 wherein said layer of silicon nitride has a thickness of between about 280 and 320 Angstroms.

8. The method of claim 1 wherein said electrical contact regions are above source/drain regions of a metal oxide semiconductor field effect transistor.

9. The method of claim 1 wherein said layer of insulator dielectric is borophosphosilicate glass.

10. The method of claim 1 wherein said first layer of polysilicon oxide is thermally grown $SiO_2$.

11. The method of claim 1 wherein said second layer of polysilicon oxide is thermally grown $SiO_2$.

12. A method of forming capacitors, comprising the steps of:

providing a silicon substrate having devices formed therein;

providing electrical contact regions on said silicon substrate;

forming a number of polysilicon first capacitor plates on said silicon substrate wherein said polysilicon first capacitor plates are insulated from said silicon substrate by a first dielectric;

forming a layer of second dielectric over said silicon wafer covering said polysilicon first capacitor plates;

removing that part of said layer of second dielectric directly over said polysilicon first capacitor plates;

removing that part of said layer of second dielectric directly over said electrical contact regions;

forming a first layer of polysilicon oxide over said polysilicon first capacitor plates;

forming a first layer of silicon oxide over said electrical contact regions;

removing said first layer of polysilicon oxide and said first layer of silicon oxide by means of etching;

forming a second layer of polysilicon oxide over said polysilicon first capacitor plates after removing said first layer of polysilicon oxide;

forming a second layer of silicon oxide over said electrical contact regions after removing said first layer of silicon oxide;

forming a layer of silicon nitride over said silicon wafer covering said second layer of polysilicon oxide;

forming a patterned layer of photoresist over said layer of silicon nitride wherein photoresist remains only directly above said polysilicon first capacitor plates;

removing that part of said layer of silicon nitride not directly above said polysilicon first capacitor plates;

forming a layer of first metal over said silicon substrate covering said part of said layer of silicon nitride not directly above said polysilicon first capacitor plate; and patterning said layer of first metal whereby there is first metal directly above said first capacitor plates, thereby forming second capacitor plates, and first metal directly above said electrical contact regions.

13. The method of claim 12 wherein said polysilicon first capacitor plates have a thickness of between about 4000 and 4400 Angstroms.

14. The method of claim 12 wherein said first layer of polysilicon oxide has a thickness of between about 150 and 250 Angstroms.

15. The method of claim 12 wherein said second layer of polysilicon oxide has a thickness of between about 150 and 250 Angstroms.

16. The method of claim 12 wherein said removing said first layer of polysilicon oxide and said first layer of silicon oxide uses etching in a wet buffered oxide etch at a temperature of between about 22.5° and 25° C. for between about 30 and 40 seconds.

17. The method of claim 12 wherein said removing said first layer of polysilicon oxide and said first layer of silicon oxide uses dry vertical anisotropic etching.

18. The method of claim 12 wherein said layer of silicon nitride has a thickness of between about 280 and 320 Angstroms.

19. The method of claim 12 wherein said electrical contact regions are above source/drain regions of a metal oxide semiconductor field effect transistor.

20. The method of claim 12 wherein said layer of second dielectric is borophosphosilicate glass.

21. The method of claim 12 wherein said first layer of polysilicon oxide is thermally grown $SiO_2$.

22. The method of claim 12 wherein said second layer of polysilicon oxide is thermally grown $SiO_2$.

* * * * *